(12) United States Patent  
Zhu et al.

(10) Patent No.: US 7,250,800 B2
(45) Date of Patent: Jul. 31, 2007

(54) CLOCK PULSE WIDTH CONTROL CIRCUIT

(75) Inventors: Quanhong Zhu, Windsor, CO (US);
Don D. Josephson, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/179,400

(22) Filed: Jul. 12, 2005

(65) Prior Publication Data

US 2007/0013422 A1    Jan. 18, 2007

(51) Int. Cl.
*H03K 3/017* (2006.01)

(52) U.S. Cl. ................ 327/172; 327/175; 327/291

(58) Field of Classification Search ............... None
See application file for complete search history.

(56) References Cited

U.S. PATENT DOCUMENTS

| | | | |
|---|---|---|---|
| 4,284,926 A * | 8/1981 | Dinges ................ 315/312 |
| 4,430,617 A * | 2/1984 | Kuhlmann ............ 327/114 |
| 5,808,961 A | 9/1998 | Sawada | |
| 5,920,211 A * | 7/1999 | Anderson et al. ....... 327/116 |
| 6,028,461 A | 2/2000 | Kobayashi | |
| 6,034,557 A * | 3/2000 | Schultz et al. ......... 327/276 |
| 6,097,228 A * | 8/2000 | Fujisawa et al. ....... 327/198 |
| 6,275,446 B1 | 8/2001 | Abedifard | |
| 6,456,562 B1 | 9/2002 | Abedifard | |
| 6,683,483 B1 * | 1/2004 | Witte et al. ........... 327/172 |
| 6,750,692 B2 | 6/2004 | Jang | |
| 6,865,136 B2 | 3/2005 | Sunaga | |
| 6,914,467 B2 * | 7/2005 | Feng et al. ........... 327/261 |
| 2003/0218490 A1 | 11/2003 | Jang | |
| 2003/0226054 A1 | 12/2003 | Benno | |
| 2004/0080349 A1 | 4/2004 | Kawahito | |
| 2004/0160252 A1 | 8/2004 | Gotzenberger | |
| 2004/0257132 A1 | 12/2004 | Park | |
| 2005/0105345 A1 | 5/2005 | Kim | |
| 2005/0122147 A1 | 6/2005 | Park | |
| 2005/0122148 A1 | 6/2005 | Park | |

* cited by examiner

*Primary Examiner*—Quan Tra
*Assistant Examiner*—Khareem E Almo

(57) ABSTRACT

In one embodiment, a clock pulse width control circuit, comprises a plurality of timer circuits to generate a corresponding plurality of delayed pulse signals from an input clock signal, a corresponding plurality of AND gates, each AND gate generating an output signal from a delayed pulse signal and the input clock signal, and a selection circuit to select one of the output signals.

14 Claims, 3 Drawing Sheets

CLOCK PULSE WIDTH CONTROL CIRCUIT

BACKGROUND

This application relates to integrated circuits, and more particularly to a circuit for creating a clock signal with a controllable pulse width.

Dynamic logic circuits are often used in modern integrated circuits. Decay or discharge of a non-driven node over time in a dynamic logic circuit can cause errors. To prevent these types of errors, it may be desirable to shorten one phase of a clock that regulates the timing of some dynamic circuits. By shortening this phase, the amount of time a node spends non-driven may be shortened without affecting the overall average clock cycle time, which may be critical to system performance.

SUMMARY

In one embodiment, a clock pulse width control circuit, comprises a plurality of timer circuits to generate a corresponding plurality of delayed pulse signals from an input clock signal, a corresponding plurality of AND gates, each AND gate generating an output signal from a delayed pulse signal and the input clock signal, and a selection circuit to select one of the output signals.

DETAILED DESCRIPTION

In the following detailed description, numerous specific details are set forth in order to provide a thorough understanding of the subject matter. However, it will be understood by those skilled in the art that the subject matter of the appended claims may be practiced without certain of these specific details. In other instances, well-known methods, procedures, components and circuits have not been described in detail so as not to obscure.

Figure 1:
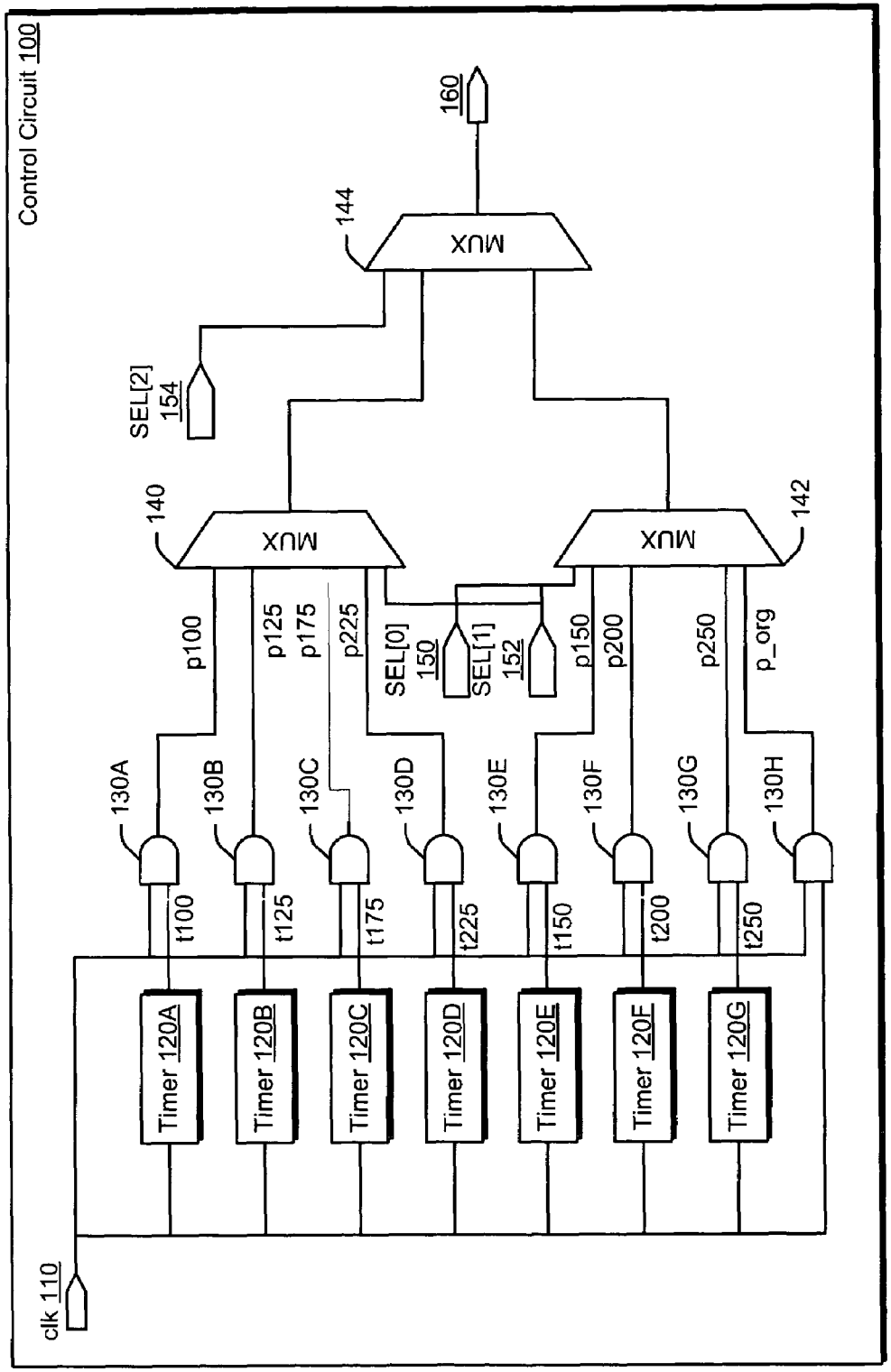
FIG. 1 is a schematic illustration of a clock pulse width control circuit in accordance with one embodiment.

FIG. 1 is a schematic illustration of a clock pulse width control circuit 100 in accordance with one embodiment. Referring to FIG. 1, a clock pulse width control circuit 100 accepts as a input a clock signal 110 and three control signals 150, 152, 154. The components of clock pulse width control circuit 100 manipulate the clock signal input 110 as a function of the control signal inputs 150, 152, 154 to generate an output signal on chopper 160. The rising edge of the input clock signal 110 generates both the rising edge and the falling edge of the output clock signal on chopper 160.

In one embodiment, clock pulse width control circuit 100 includes seven timer circuits 120A–120G. The clock signal 110 is coupled to the timer circuits 120A–120G. Clock pulse width control circuit 100 further includes eight AND gates 130A–130H. The clock signal 110 and the output of each timer circuit 120A–120G is coupled to a respective AND gate 130A–130G. One AND gate 130H is coupled to the clock signal 110 as input on two terminals. The output of AND gates 130A–130D are coupled to a first multiplexer 140, and the output of AND gates 130E–130H are coupled to a second multiplexer 142. The output of multiplexers 140 and 142 are coupled to a third multiplexer 144.

In the embodiment illustrated in FIG. 1, the seven timer circuits 120A–120G and eight AND gates 130A–130H are capable of generating eight different pulse width patterns. Multiplexers 140, 142, 144 are controlled by control signals 150, 152, 154 to select one of the eight pulse width patterns to be output as the CHOP signal 160. Table I provides relationships between the control signals Sel[2:0] and the output pulse width (in pico seconds) and the period (in nanoseconds) of the output signal for one embodiment of the clock pulse width control circuit 100. The values in Table I are for an input clock signal 110 that is not higher than 200 MHz.

TABLE I

| Output Signal Characteristics | | | | |
|---|---|---|---|---|
| Sel[2] | Sel[1] | Sel[0] | Output Pulse Width (ps) | Period (ns) |
| 0 | 0 | 0 | 1500 | 5 |
| 0 | 0 | 1 | 2000 | 5 |
| 0 | 1 | 0 | 2500 | 5 |
| 0 | 1 | 1 | Bypass | Bypass |
| 1 | 0 | 0 | 1000 | 5 |
| 1 | 0 | 1 | 1250 | 5 |
| 1 | 1 | 0 | 1500 | 5 |
| 1 | 1 | 1 | 1750 | 5 |

Figure 2:
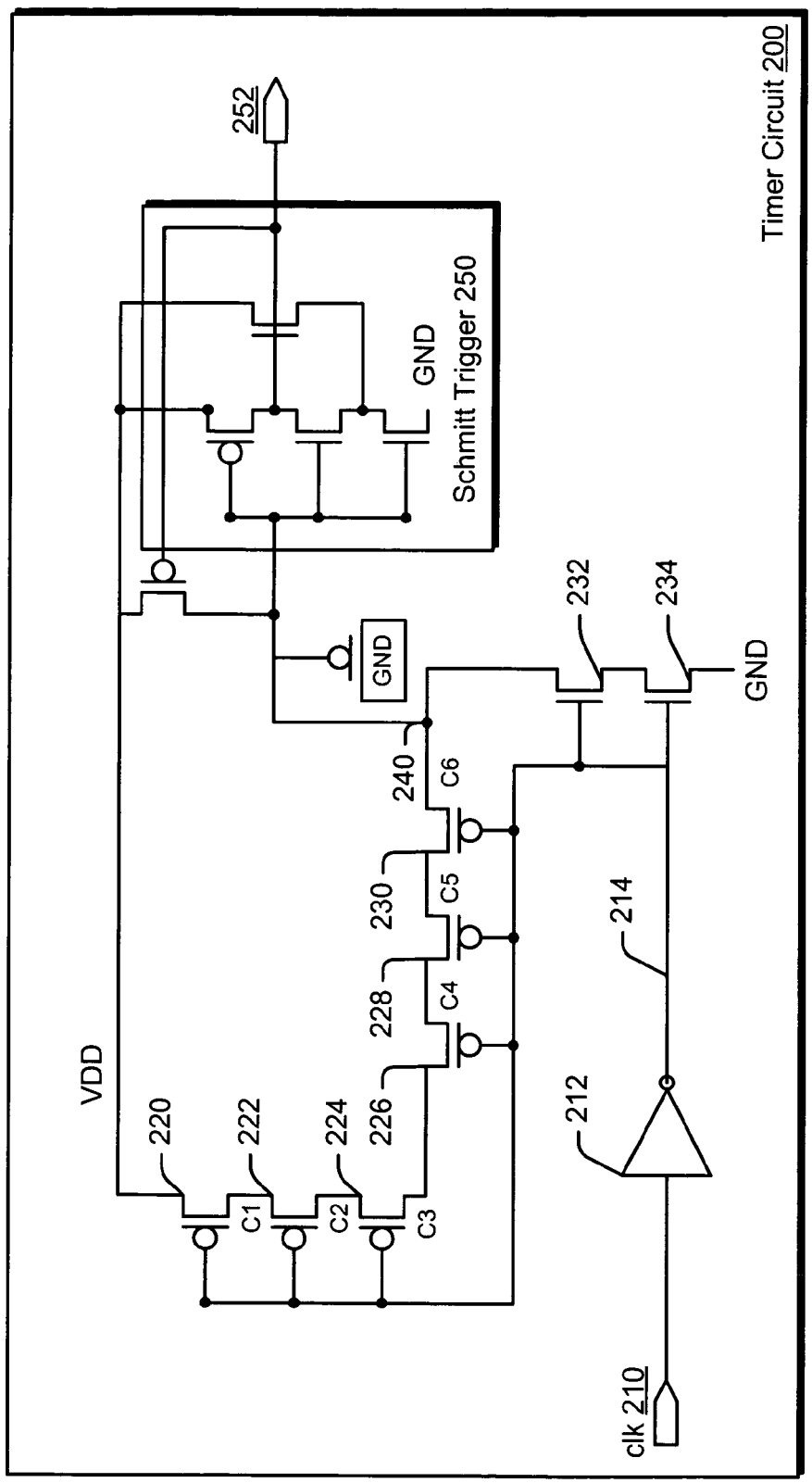
FIG. 2 is a schematic illustration of a timer circuit in accordance with one embodiment.

FIG. 2 is a schematic illustration of a timer circuit 200 in accordance with one embodiment. One or more of the timers 120A–120G may be constructed in accordance with the embodiment depicted in FIG. 2. Referring to FIG. 2, timer circuit 200 includes a clock input 210, an inverter 212, an array of p-transistors 220–230, discharge transistors 232, 234, and Schmitt trigger 250. In one embodiment, the source of p-transistors 220 is connected to VDD, and the respective sources and drains of the remaining p-transistors are connected in series, as illustrated in FIG. 2. The gates of p-transistors 220–230 are connected to inverted input signal 214.

In operation, timer circuit 200 accepts a clock signal (tck) 210 as an input. Clock signal 210 is passed through an inverter 212 to generate an inverse signal (ntck) 214. When input clock signal 210 goes high, inverse signal (ntck) 214 goes low, which enables p transistors 220–230 to be charged up to VDD. When the voltage at node 240 exceeds the trigger point value of Schmitt trigger 250, the output 252 of Schmitt trigger 250 switches from high to low.

By contrast, when the input clock goes low, the voltage at node 240 is discharged through the discharge transistors 232, 234. When the voltage at node 240 falls below the trigger point value of Schmitt trigger 250, the output 252 of Schmitt trigger 250 switches from low to high.

The delay between the rising edge transition of input clock signal 210 and the falling edge of output signal 252 is a function of the values of ptr-transistors 220–230 and the trigger value of Schmitt trigger 250. Similarly, the delay between the transition of the falling edge of input clock signal and the rising edge of output signal 252 is a function of the discharge transistors 232, 234 and the trigger value of Schmitt trigger 250. In one embodiment, the components are selected such that the delay between the rising edge of the input clock signal 210 and the falling edge of the output clock signal 252 is longer than the delay between the falling edge of the input clock signal 210 and the rising edge of the output clock signal 252.

Referring back to FIG. 1, in one embodiment each of the seven timers 120A–120G may be constructed in accordance with the circuit of FIG. 2. Table II provides exemplary values for the various components of each timer circuit 120A–120G and the resulting output signal.

TABLE II

Circuit Component Characteristics

| Timer # | P-Transistor Capacitance Value (fF) | Discharge Transistor Value (microns) | Schmitt Trigger Threshold (mV) | Delay (Rising Edge) (ps) | Delay (Falling Edge) (ps) |
|---|---|---|---|---|---|
| 100 | 38.93 | 1.22/0.1 | Lo–hi 564 Hi–lo 534 | 1.0 ns | 100 ps |
| 125 | 38.50 | 1.22/0.1 | Lo–hi 564 Hi–lo 534 | 1.25 ns | 100 ps |
| 150 | 38.33 | 1.22/0.1 | Lo–hi 564 Hi–lo 534 | 1.50 ns | 100 ps |
| 175 | 38.09 | 1.22/0.1 | Lo–hi 564 Hi–lo 534 | 1.75 ns | 100 ps |
| 200 | 37.98 | 1.22/0.1 | Lo–hi 564 Hi–lo 534 | 2.00 ns | 100 ps |
| 225 | 37.90 | 1.22/0.1 | Lo–hi 564 Hi–lo 534 | 2.25 ns | 100 ps |
| 250 | 37.85 | 1.22/0.1 | Lo–hi 564 Hi–lo 534 | 2.50 ns | 100 ps |

The output of each timer circuit 120A–120G is ANDed with the clock signal 110 in respective AND gates 130A–130G, resulting in a pulse clock signal that is triggered by the rising edge of the clock signal. The width of pulse clock signal is determined by the values of the components of FIG. 2 (See Table II).

Figure 3:
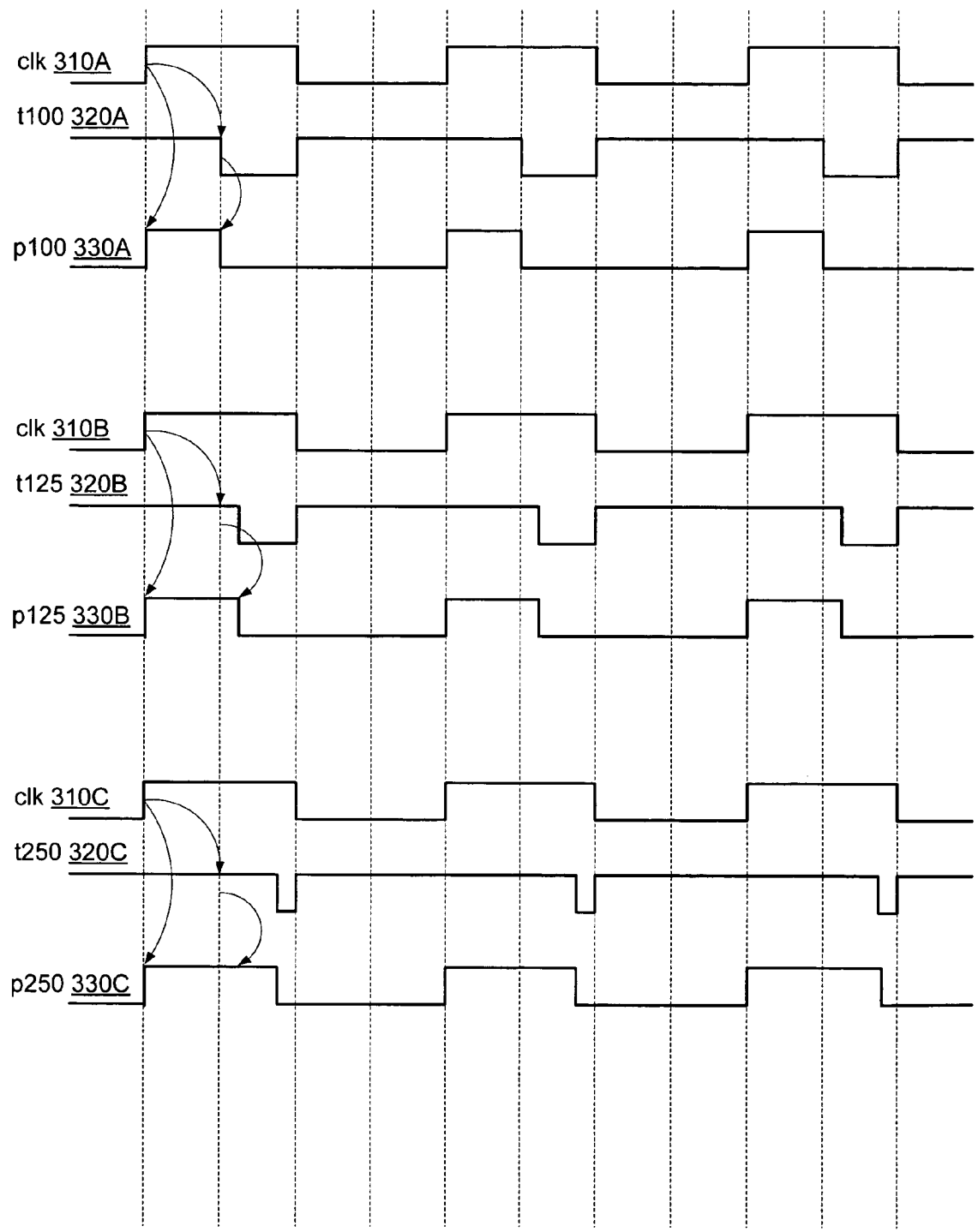
FIG. 3 is an example timing diagram in accordance with an embodiment.

FIG. 3 is an example timing diagram in accordance with an embodiment. FIG. 3 illustrates three sets of waveforms. Each set includes an input clock signal (tclk) 310A–310C, a delayed pulse signal 320A–320C generated by a timer circuit such as one of timer circuits 120A–120G, and an output signal 330A–330C generated by the logical AND of the input clock signal and the output signal from the timer circuit.

Referring to FIG. 3, the input clock signal 310A alternates between a logic high and a logic low on a regular, periodic basis in time. The rising edge of input clock signal 310A triggers a falling edge on delayed pulse signal 320A. In one embodiment, the delay between the rising edge of input clock signal 310A and the falling edge of delayed pulse signal 320A is a function of the time required to charge the capacitance of p transistors 220–230 in timer circuit 200.

The falling edge of input clock signal 310A triggers a rising edge on delayed pulse signal 320A. In one embodiment, there may be a delay between the falling edge of input clock signal 310A and the rising edge of delayed pulse signal 320A which is a function of the time required to discharge the voltage at node 240 through discharge transistors 232, 234.

Output signal 330A represents the logical AND of the input clock signal 310A and the delayed pulse signal 320A. The rising edge of the clock signal 310A triggers both the rising edge and the falling edge of the output signal 330A. The falling edge of the input clock signal 310A does not generate a pulse in the output signal 330.

Input clock signals 310B, 310C delayed pulse signals 320B, 320C and output signals 330B, 330C reflect similar patterns, but with different pulse widths. In one embodiment, the difference in pulse widths of the output signal result from differences in the delay implemented by timer circuits 120A–120G.

The embodiment described herein utilized seven timer circuits and eight AND gates to produce eight different output clocks. In alternate embodiments a different number of timer circuits and AND gates may be implemented to produce a different number of output clocks. In general, to produce N output clocks, the circuit 100 requires (N-1) timer circuits and N AND gates.

In the description and claims, the terms coupled and connected, along with their derivatives, may be used. In particular embodiments, connected may be used to indicate that two or more elements are in direct physical or electrical contact with each other. By contrast, coupled may mean that two or more elements are in direct physical or electrical contact. However, coupled may also mean that two or more elements may not be in direct contact with each other, but yet may still cooperate or interact with each other.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A clock pulse width control circuit, comprising:
   a plurality of timer circuits to generate a plurality of delayed pulse signals from an input clock signal wherein at least one timer circuit comprises:
     a first circuit to generate an output signal corresponding to a delay in a rising edge of the clock signal, wherein the first circuit comprises:
       an asymmetric unbalanced inverter to invert the rising edge of the control signal;
       at least one capacitive element coupled to an output of the inverter; and
       a Schmitt trigger coupled to the capacitive element; and
     a second circuit to generate an output signal corresponding to a delay in a falling edge of the clock signal;
   a corresponding plurality of AND gates, each AND gate generating an output signal from a delayed pulse signal and the input clock signal; and
   a selection circuit to select one of the output signals.

2. The clock pulse width control circuit of claim 1, wherein the second circuit comprises at least one discharge transistor coupled to the capacitive element and the Schmitt trigger.

3. The clock pulse width control circuit of claim 1, further comprising a bypass AND gate to generate an output signal from the clock signal.

4. The clock pulse width control circuit of claim 1, wherein the output signal generated by the AND gates comprises:
   a rising edge delayed by a first time period from the rising edge of the input clock signal;
   a falling edge delayed by a second time period from the rising edge of the input clock signal.

5. The clock pulse width control circuit of claim 1, wherein the selection circuit comprises at least one multiplexer.

6. A clock pulse width control circuit, comprising:
a timer circuit to generate a delayed pulse signal from an input clock signal, wherein the timer circuit comprises:
a first circuit to generate an output signal corresponding to a delay in a rising edge of the clock signal, wherein the first circuit comprises:
an asymmetric unbalanced inverter to invert the rising edge of the control signal;
at least one capacitive element coupled to an output of the inverter; and
a Schmitt trigger coupled to the capacitive element; and
a second circuit to generate an output signal corresponding to a delay in a falling edge of the clock signal,
wherein the delayed pulse signal comprises:
a falling edge delayed by a first time period in response to a rising edge in the clock signal; and
a rising edge delayed by a second time period, different from the first time period, in response to a falling edge in the clock signal; and
an AND gate to generate an output signal from the delayed pulse signal and the input clock signal.

7. The clock pulse width control circuit of claim 6, wherein the second circuit comprises at least one discharge transistor coupled to the capacitive element and the Schmitt trigger.

8. The clock pulse width control circuit of claim 6, further comprising a bypass AND gate to generate an output signal from the clock signal.

9. The clock pulse width control circuit of claim 6, wherein the output signal generated by the AND gate comprises:
a rising edge delayed by a first time period from the rising edge of the input clock signal;
a falling edge delayed by a second time period from the rising edge of the input clock signal.

10. A clock pulse width control circuit, comprising:
means for generating a plurality of delayed pulse signals from an input clock signal, wherein the means for generating a plurality of delayed pulse signals from an input clock signal comprises:
a first circuit to generate an output signal corresponding to a delay in a rising edge of the clock signal, wherein the first circuit comprises:
an asymmetric unbalanced inverter to invert the rising edge of the control signal;
at least one capacitive element coupled to an output of the inverter; and
a Schmitt trifler coupled to the capacitive element; and
a second circuit to generate an output signal corresponding to a delay in a falling edge of the clock signal;
means for generating a corresponding plurality of output signals from the delayed pulse signals and the input clock signal; and
means for selecting one of the output signals.

11. The clock pulse width control circuit of claim 10, wherein the second circuit comprises at least one discharge transistor coupled to the capacitive element and the Schmitt trigger.

12. The clock pulse width control circuit of claim 10, further comprising a bypass AND gate to generate an output signal from the clock signal.

13. The clock pulse width control circuit of claim 10, wherein the output signals comprise:
a rising edge delayed by a first time period from the rising edge of the input clock signal;
a falling edge delayed by a second time period from the rising edge of the input clock signal.

14. The clock pulse width control circuit of claim 10, wherein the means for selecting one of the output signals comprises at least one multiplexer.

* * * * *

UNITED STATES PATENT AND TRADEMARK OFFICE
CERTIFICATE OF CORRECTION

| | |
|---|---|
| PATENT NO. | : 7,250,800 B2 |
| APPLICATION NO. | : 11/179400 |
| DATED | : July 31, 2007 |
| INVENTOR(S) | : Quanhong Zhu et al. |

It is certified that error appears in the above-identified patent and that said Letters Patent is hereby corrected as shown below:

In column 6, line 13, in Claim 10, delete "trifler" and insert -- trigger --, therefor.

Signed and Sealed this

Fifteenth Day of July, 2008

JON W. DUDAS
*Director of the United States Patent and Trademark Office*